US011755065B2

(12) United States Patent
Ogura et al.

(10) Patent No.: US 11,755,065 B2
(45) Date of Patent: Sep. 12, 2023

(54) DISPLAY MANUFACTURING DEVICE AND MANUFACTURING METHOD, AND DISPLAY

(71) Applicant: Panasonic Intellectual Property Management Co., Ltd., Osaka (JP)

(72) Inventors: Motonari Ogura, Osaka (JP); Hisato Morita, Osaka (JP); Daisuke Komoda, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 833 days.

(21) Appl. No.: 16/742,073

(22) Filed: Jan. 14, 2020

(65) Prior Publication Data

US 2020/0150718 A1 May 14, 2020

Related U.S. Application Data

(63) Continuation of application No. PCT/JP2018/006348, filed on Feb. 22, 2018.

(30) Foreign Application Priority Data

Aug. 25, 2017 (JP) ................. 2017-161815

(51) Int. Cl.
*H01J 9/00* (2006.01)
*G06F 1/16* (2006.01)
(Continued)

(52) U.S. Cl.
CPC .............. *G06F 1/1609* (2013.01); *H01J 9/00* (2013.01); *H01J 9/28* (2013.01); *H01L 33/0095* (2013.01)

(58) Field of Classification Search
CPC ........................................................ H01J 9/00
See application file for complete search history.

(56) References Cited

U.S. PATENT DOCUMENTS

2002/0196393 A1 12/2002 Tashiro et al.
2009/0183819 A1 7/2009 Matsulura
(Continued)

FOREIGN PATENT DOCUMENTS

JP 2002-254010 9/2002
JP 2003-5194 1/2003
(Continued)

OTHER PUBLICATIONS

Extended European Search Report dated May 13,2020incorresponding European Patent Application No. 18848291.3.
(Continued)

*Primary Examiner* — Joseph L Williams
(74) *Attorney, Agent, or Firm* — Wenderoth, Lind & Ponack, L.L.P.

(57) ABSTRACT

A display manufacturing device sticks a transparent panel to a display panel, the display panel including a front surface having a periphery covered by a bezel. The display manufacturing device includes: a dispenser that makes a dam by dispensing a light curable resin to straddle the front surface of the display panel and the bezel, and be along an inner peripheral edge of the bezel to stick the transparent panel to the front surface of the display panel; and at least one light irradiation device that emits light that cures the dam. The at least one light irradiation device emits the light in a direction that forms an acute angle between the direction and the front surface of the display panel, the direction being a direction that allows the light to reach the light curable resin that has entered a gap between the front surface and the bezel.

10 Claims, 10 Drawing Sheets

(51) Int. Cl.
*H01L 33/00* (2010.01)
*H01J 9/28* (2006.01)

(56) References Cited

U.S. PATENT DOCUMENTS

2015/0070602 A1 3/2015 Fujita
2016/0262273 A1 9/2016 Fujita et al.

FOREIGN PATENT DOCUMENTS

| | | |
|---|---|---|
| JP | 2006-167620 | 6/2006 |
| JP | 2012-220781 | 11/2012 |
| JP | 2013-15760 | 1/2013 |
| JP | 2013-88455 | 5/2013 |
| JP | 2015-72447 | 4/2015 |
| WO | 2014/104231 | 7/2014 |

OTHER PUBLICATIONS

International Search Report dated Apr. 24, 2018 in International (PCT) Application No. PCT/JP2018/006348.

DISPLAY MANUFACTURING DEVICE AND MANUFACTURING METHOD, AND DISPLAY

BACKGROUND

1. Technical Field

The present disclosure relates to displays such as a liquid-crystal display, and a manufacturing device and a manufacturing method for manufacturing the displays.

2. Description of the Related Art

As disclosed in PTL 1, adhesive is conventionally used to stick a transparent panel, such as a cover panel or a touch panel, to a display panel that displays an image. PTL 1 discloses dam and fill as an example of methods for sticking a transparent panel to a display panel with adhesive.

In the dam and fill disclosed in Patent Literature (PTL) 1, first, a first light curable resin (adhesive) having a high viscosity is used to make a dam that is annular on a front surface of a display panel to which a transparent panel will be stuck. Next, light is radiated to the dam to cure the dam. Next, a second light curable resin (adhesive) having a low viscosity is filled into the dam that has cured. The transparent panel is disposed on the dam in such a manner that the transparent panel covers the second light curable resin and the dam. The transparent panel is stuck to the display panel by curing the second light curable resin in the dam.

Here, PTL 1 is Unexamined Japanese Patent Publication No. 2013-88455.

SUMMARY

In recent years, it has been desired to stick a transparent panel, such as a touch panel, to a large display panel used for a large display. However, a bezel is often attached to the large display panel to restrict a warp in the large display panel. More specifically, a bezel made of metal covers a periphery of a front surface of a display panel, and thus increases rigidity of the display panel against a warp.

In case of such a display panel to which a bezel is attached, an adhesive that has a low viscosity and has been filled into a dam may go over the dam and enter a gap between a front surface of the display panel and the bezel while dam and fill is performed. The adhesive that has a low viscosity and has entered the gap may reach a circuit board or optical components in a display module that includes the display panel and the bezel. If the adhesive reaches a circuit board or optical components, a short circuit occurs at the circuit board, or contaminants on an optical path cause failure of a display surface. Eventually, reliability of a display decreases. If an adhesive that has entered the gap is a light curable resin, the adhesive has not cured even after a product is marketed as ultra-violet light does not reach the adhesive. Having not been cured the adhesive causes a defective product.

The present disclosure provides a technique that appropriately sticks a transparent panel, such as a cover panel or a touch panel, to a display panel whose periphery of a front surface is covered by a bezel, and thus manufactures a display that has high reliability.

An aspect of the present disclosure provides a display manufacturing device for sticking a transparent panel to a display panel, the display panel including a front surface having a periphery covered by a bezel. The display manufacturing device includes: a dispenser that makes a dam by dispensing a light curable resin to straddle the front surface of the display panel and the bezel, and be along an inner peripheral edge of the bezel to stick the transparent panel to the front surface of the display panel; and at least one light irradiation device that emits light that cures the dam. The at least one light irradiation device emits the light in a direction that forms an acute angle between the direction and the front surface of the display panel, the direction being a direction that allows the light to reach the light curable resin that has entered a gap between the front surface and the bezel.

Another aspect of the present disclosure provides a display manufacturing method for sticking a transparent panel to a display panel, the display panel including a front surface having a periphery covered by a bezel. The display manufacturing method includes: making a dam by causing a dispenser to dispense a light curable resin to straddle the front surface of the display panel and the bezel, and be along an inner peripheral edge of the bezel to stick the transparent panel to the front surface of the display panel; and curing the dam with light from a light irradiation device. The light irradiation device emits the light in a direction that forms an acute angle between the direction and the front surface of the display panel, the direction being a direction that allows the light to reach the light curable resin that has entered a gap between the front surface of the display panel and the bezel.

Yet another aspect of the present disclosure provides a display that includes: a display panel; a bezel disposed to cover a periphery of a front surface of the display panel; a first adhesive that is a light curable resin, the first adhesive being disposed like a dam to straddle the front surface of the display panel and the bezel, and be along an inner peripheral edge of the bezel; a second adhesive filled in the dam; and a transparent panel stuck to the front surface of the display panel with the first and the second adhesives.

According to the present disclosure, a transparent panel, such as a cover panel or a touch panel, is appropriately stuck to a display panel whose periphery of a front surface is covered by a bezel, and thus a display that has high reliability is manufactured.

DETAILED DESCRIPTION

Figure 1:
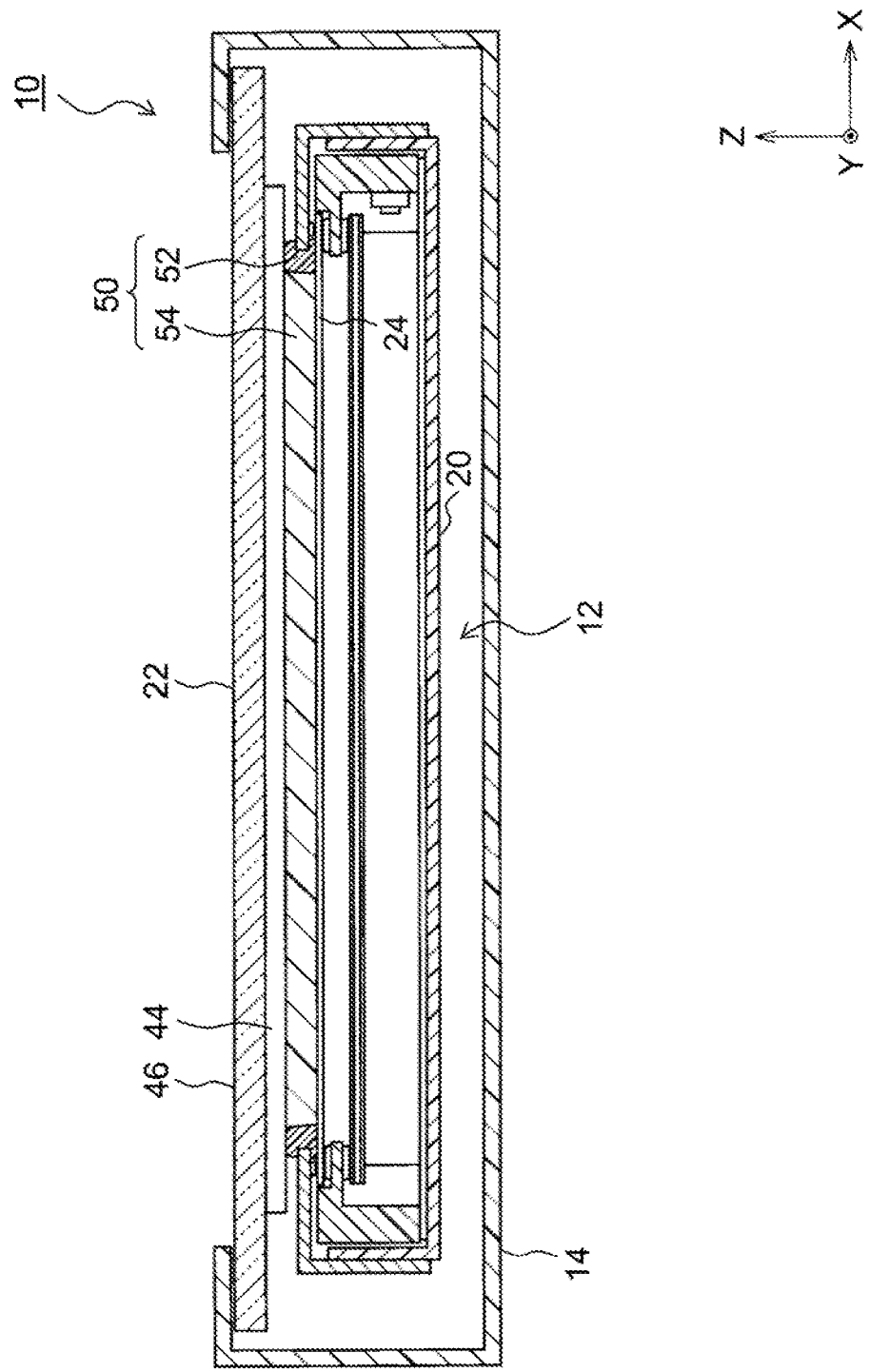
FIG. 1 is a schematic cross-sectional view of a display according to an exemplary embodiment of the present disclosure.

A display manufacturing device according to an aspect of the present disclosure is a display manufacturing device for sticking a transparent panel to a display panel whose periphery of a front surface is covered by a bezel. The display manufacturing device includes: a dispenser that dispenses a light curable resin used to stick the transparent panel to the front surface of the display panel, and makes a dam by dispensing the light curable resin in such a manner that the light curable resin straddles the front surface of the display panel and the bezel, and that the light curable resin is along an inner peripheral edge of the bezel; and at least one light irradiation device that emits light that cures the dam. The at least one light irradiation device emits light in a direction that forms an acute angle between the direction and the front surface of the display panel, the direction being a direction that allows the light to reach the light curable resin that has entered a gap between the front surface and the bezel.

According to the aspect, a transparent panel, such as a cover panel or a touch panel, is appropriately stuck to a display panel whose periphery of a front surface is covered by a bezel, and thus a display that has high reliability is manufactured.

For example, the at least one light irradiation device is disposed in such a manner that when the at least one light irradiation device emits light onto the front surface of the display panel, at least part of a light spot of the light on the front surface exists in a gap between the front surface of the display panel and the bezel.

For example, the at least one light irradiation device is disposed in such a manner that an optical axis of the at least one light irradiation device enters a gap between the front surface of the display panel and the bezel.

For example, the display manufacturing device includes a movable head that moves relative to the display panel in such a manner that the movable head moves parallel to the front surface of the display panel, and moves along an inner peripheral edge of the bezel. For example, the dispenser and the at least one light irradiation device are attached to the movable head.

For example, an inner peripheral edge of the bezel has a rectangular shape, the at least one light irradiation device includes two light irradiation devices, the two light irradiation devices are attached to the movable head, and the movable head is configured to turn 90° about a turning center line that passes through a center of a resin dispensing outlet of the dispenser and is perpendicular to the front surface of the display panel, and the two light irradiation devices are attached to the movable head in such a manner that the two light irradiation devices have a 180° rotational symmetry about the turning center line of the movable head.

For example, the movable head moves at an adjustable speed.

For example, the front surface of the display panel has a point of intersection where the front surface intersects with an optical axis of the at least one light irradiation device, and the movable head includes a light blocking plate disposed between the point of intersection and the resin dispensing outlet of the dispenser.

For example, the dispenser makes a dam that has a low-protrusion portion, the low-protrusion portion having a height lower than a height of another portion of the dam.

For example, an inner peripheral edge of the bezel has a rectangular shape, and the low-protrusion portion is made at four corners of the rectangular shape.

A display manufacturing method according to another aspect of the present disclosure is a display manufacturing method for sticking a transparent panel to a display panel whose periphery of a front surface is covered by a bezel. The display manufacturing method includes: making a dam by causing a dispenser to dispense a light curable resin used to stick the transparent panel to the front surface of the display panel, the light curable resin being dispensed in such a manner that the light curable resin straddles the front surface of the display panel and the bezel, and that the light curable resin is along an inner peripheral edge of the bezel; and curing the dam with light from a light irradiation device. The light irradiation device emits light in a direction that forms an acute angle between the direction and the front surface of the display panel, the direction being a direction that allows the light to reach the light curable resin that has entered a gap between the front surface of the display panel and the bezel.

According to the configuration, a transparent panel, such as a cover panel or a touch panel, is appropriately stuck to a display panel whose periphery of a front surface is covered by a bezel, and thus a display that has high reliability is manufactured.

A display according to another aspect of the present disclosure includes: a display panel; a bezel disposed in such a manner that the bezel covers a periphery of a front surface of the display panel; a first adhesive that is a light curable resin, the first adhesive being disposed like a dam in such a manner that the first adhesive straddles the front surface of the display panel and the bezel, and that the first adhesive is along an inner peripheral edge of the bezel; a second adhesive filled in the dam; and a transparent panel stuck to the front surface of the display panel with the first and the second adhesives.

According to the configuration, the display has high reliability.

Exemplary embodiments will be described in detail below with reference to the drawings as appropriate. However, in some cases, an unnecessarily detailed description may be omitted. For example, a detailed description of a well-known matter and a duplicate description of a substantially same configuration may be omitted. The omission is to avoid an unnecessarily redundant description in the following description and to facilitate understanding by those skilled in the art.

Note that the inventors provide the accompanying drawings and the description below to help those skilled in the art to fully understand the present disclosure, and do not intend to use the accompanying drawings or the description below to limit the subject matter described in the claims.

Figure 2:
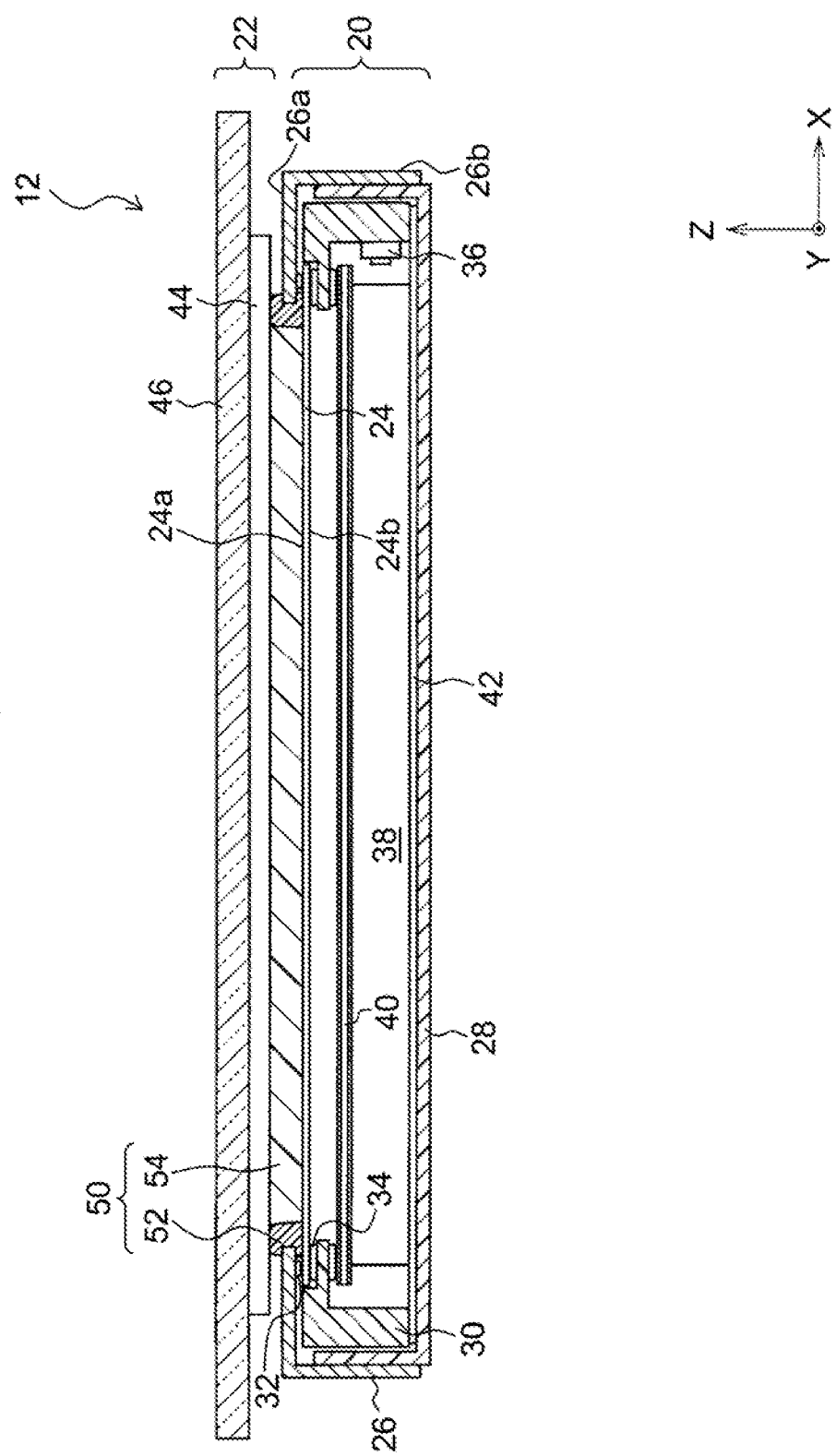
FIG. 2 is a schematic cross-sectional view of a display unit.
Figure 3:
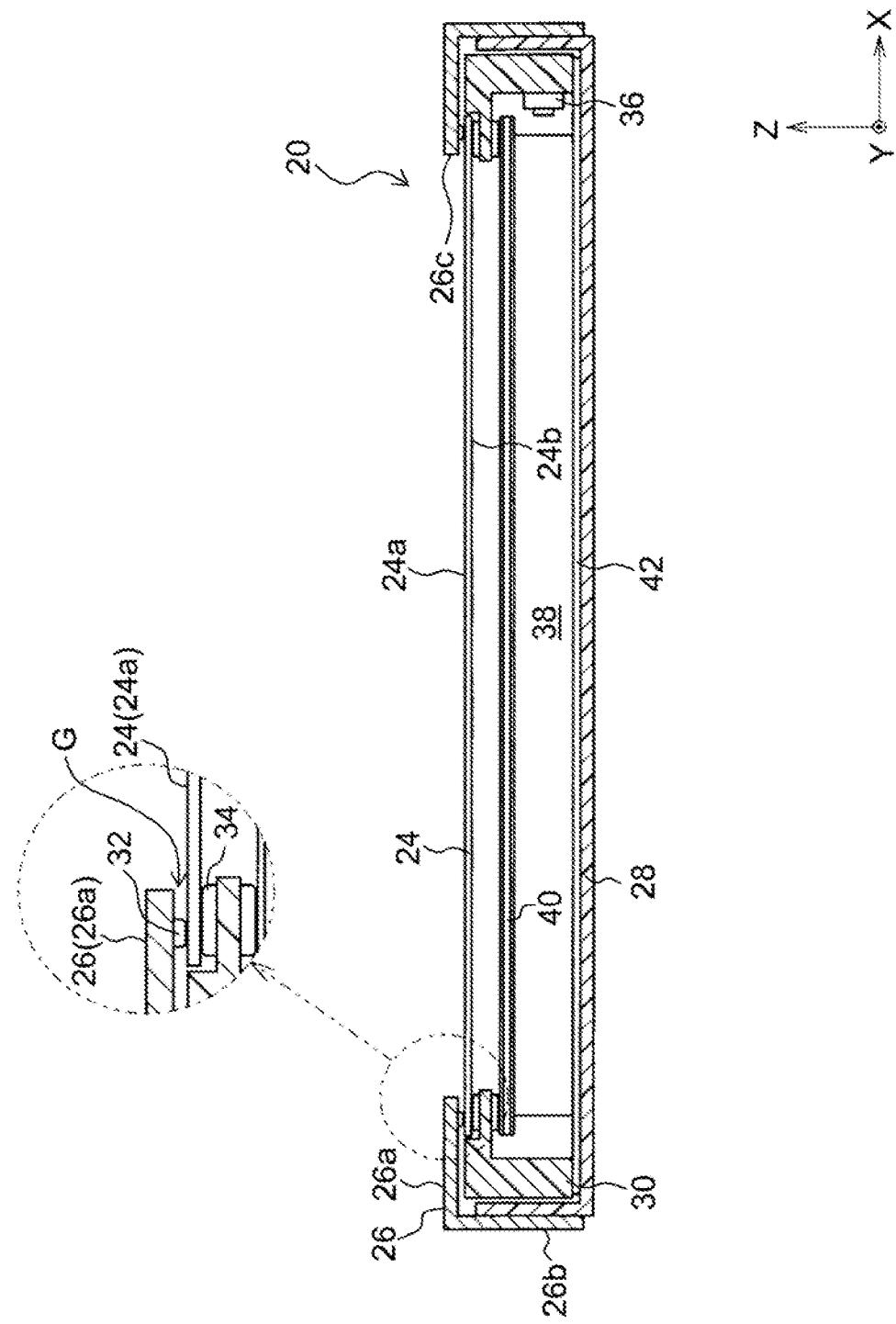
FIG. 3 is a schematic cross-sectional view of a display module.

FIG. 1 is a schematic cross-sectional view of a display according to an exemplary embodiment of the present disclosure. FIG. 2 is a schematic cross-sectional view of a display unit incorporated in the display. FIG. 3 is a schematic cross-sectional view of a display module included in the display unit. An illustrated three-dimensional X-Y-Z Cartesian coordinate system is for facilitating understanding of the present disclosure, but does not limit the present disclosure. X-axis direction represents a direction along a long side of the display, Y-axis direction represents a direction along a short side of the display, and Z-axis direction represents a direction along a thickness of the display.

Display 10 illustrated in FIG. 1 is a liquid-crystal display, for example, in the present exemplary embodiment. Display 10 includes display unit 12, and housing 14 that holds display unit 12. Housing 14 contains a controller (not illustrated) that controls display unit 12. For example, the controller receives image data from an outside, and displays the image data by means of display unit 12.

As illustrated in FIG. 2, display unit 12 includes display module 20, and transparent panel 22 stuck to display module 20.

As illustrated in FIG. 3, display module 20 includes liquid crystal display panel 24 that displays an image, bezel 26 that is made of metal and restricts a warp in liquid crystal display panel 24, bottom frame 28, and subframe 30 contained in bottom frame 28.

Liquid crystal display panel 24 has a shape like a thin plate. Display 10 displays an image shown for a viewer on liquid crystal display panel 24. A periphery of liquid crystal display panel 24 is held between cushioning member 32 disposed on a back surface of bezel 26, and cushioning member 34 disposed on subframe 30. Consequently, liquid crystal display panel 24 is held, and thus liquid crystal display panel 24 is prevented from breaking, and is prevented from rubbing against other components. Further, localized stress generated between components at a time of assembly is restricted.

Bezel 26 includes front plate 26a that covers a periphery of front surface 24a of liquid crystal display panel 24 (a surface that faces a viewer). Bezel 26 also includes side wall 26b that vertically extends from an outer peripheral edge of front plate 26a. Bottom frame 28 fits into side wall 26b of bezel 26.

In addition to subframe 30, bottom frame 28 contains light emitting diode (LED) 36, light guiding plate 38 that guides light emitted by LED 36 to back surface 24b of liquid crystal display panel 24, optical sheet 40 that optically adjusts light that proceeds from light guiding plate 38 to liquid crystal display panel 24, and reflective sheet 42 that makes light proceed to a back-surface side of reflective sheet 42 and reduces loss of light quantity.

As illustrated in FIG. 2, transparent panel 22 is stuck to front surface 24a of liquid crystal display panel 24 of display module 20. In the present exemplary embodiment, transparent panel 22 is a touch panel, and includes touch sensor glass 44, and cover glass 46 that covers touch sensor glass 44. Consequently, display 10 functions as a touch screen in the present exemplary embodiment.

Transparent panel 22 is stuck to liquid crystal display panel 24 with adhesive layer 50. More specifically, dam and fill is used to stick transparent panel 22 to liquid crystal display panel 24. The dam and fill will be described with reference to FIGS. 4 to 9. More specifically, a display manufacturing device will be described that uses the dam and fill to stick transparent panel 22 to display module 20.

First adhesive 52 and second adhesive 54 are used in the dam and fill in the present exemplary embodiment. First adhesive 52 is a light curable resin that is viscous. For example, first adhesive 52 is an ultra-violet (UV) curable resin cured by irradiation of ultra-violet light. Alternatively, a thermosetting resin cured by heat, or a room-temperature curable resin that cures at room temperature may be used. Second adhesive 54 is less viscous and more fluid than first adhesive 52. Second adhesive 54 may be a light curable resin, similarly as first adhesive 52. Alternatively, second adhesive 54 may be an adhesive that cures over time, such as a room-temperature curable resin.

Figure 4:
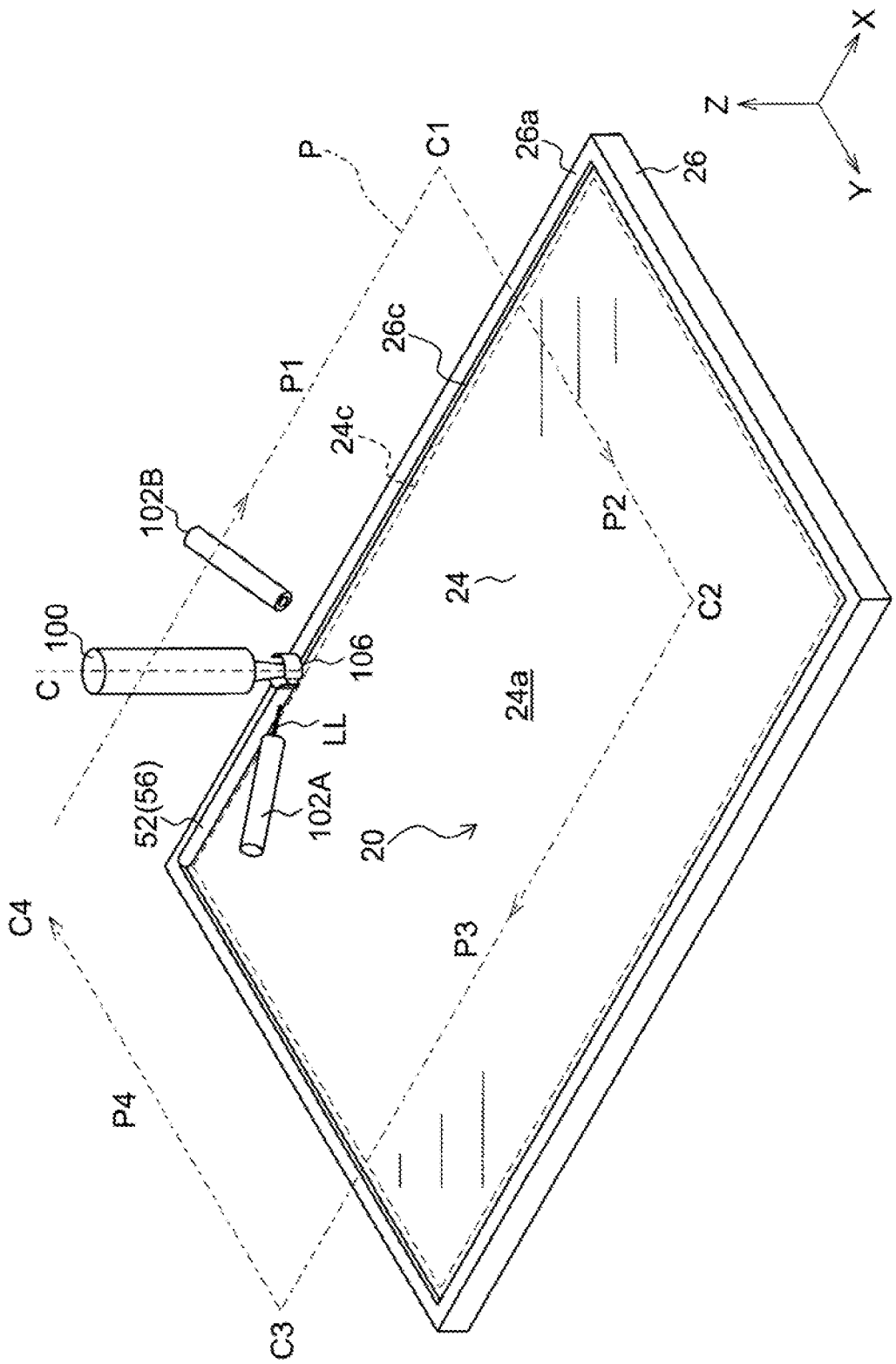
FIG. 4 is a perspective view that illustrates a method for making a dam on the display module.

As illustrated in FIG. 4, in dam and fill, dam 56 made of first adhesive 52 is made on front surface 24a of liquid crystal display panel 24.

Figure 5:
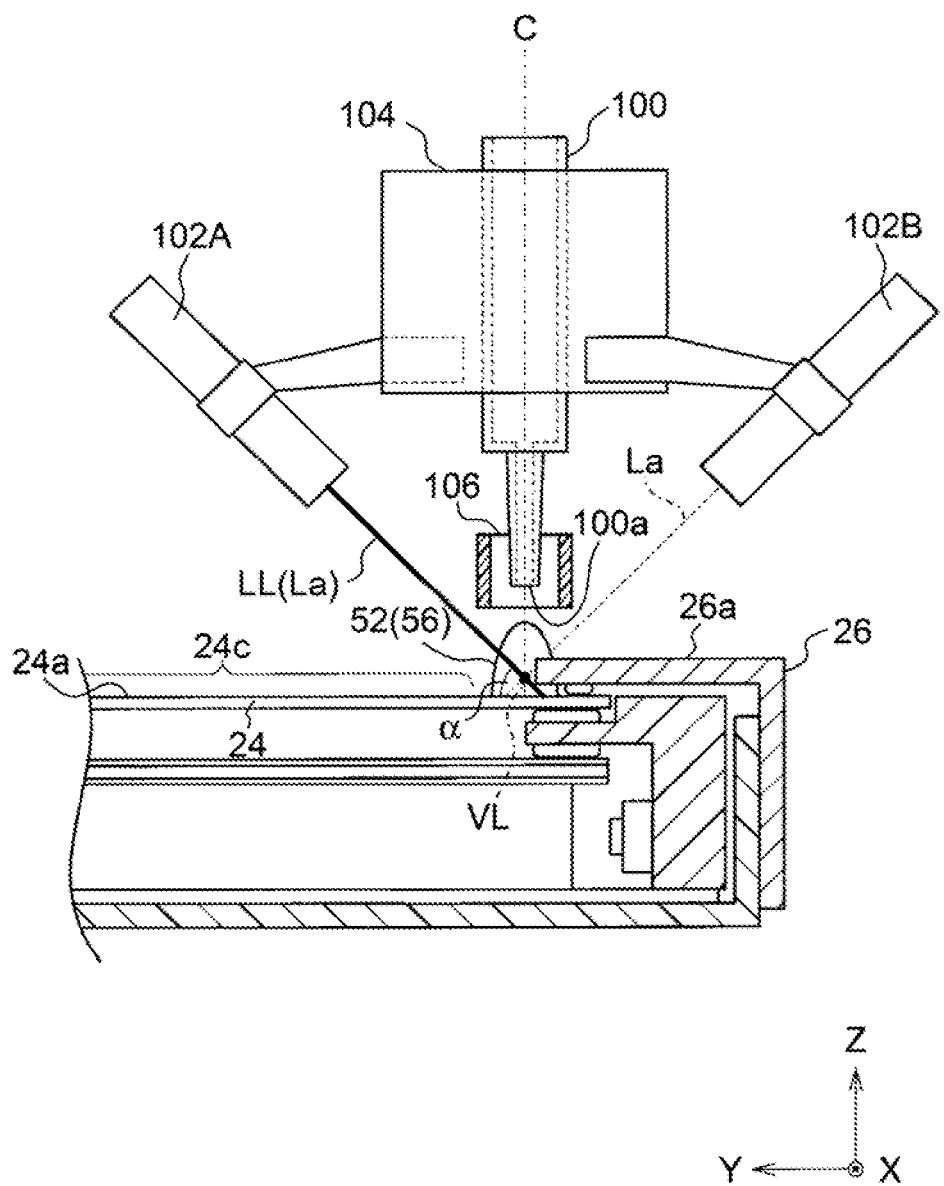
FIG. 5 is a schematic view that illustrates a movable head of a display manufacturing device that is making a dam.
Figure 6:
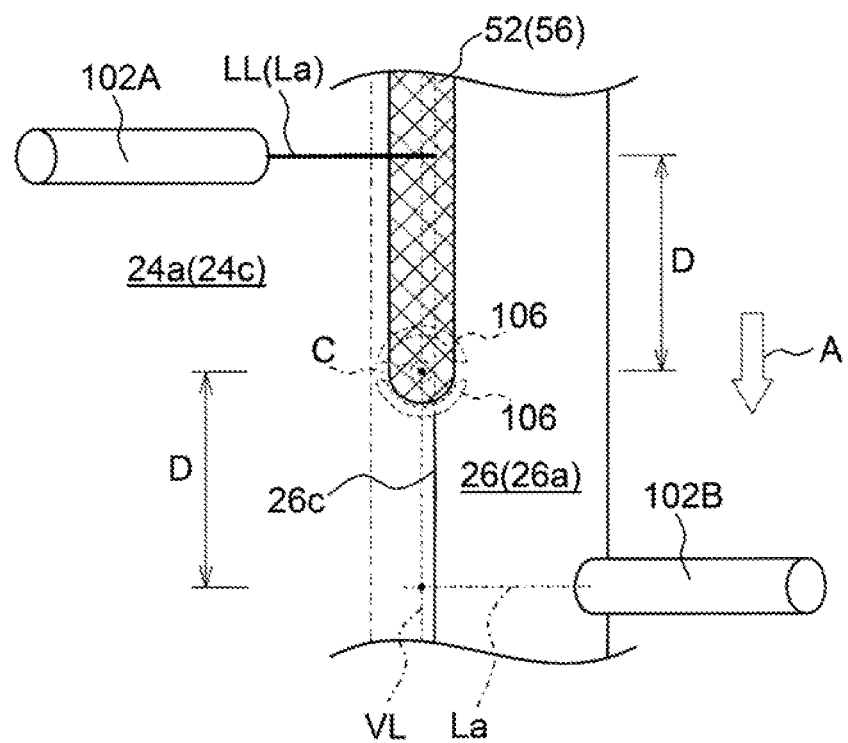
FIG. 6 is a top view that illustrates a positional relationship between a dispenser and UV irradiation devices.

More specifically, as illustrated in FIGS. 5 and 6, the display manufacturing device includes dispenser 100 that dispenses first adhesive 52, first and second UV irradiation devices 102A, 102B (light irradiation devices), and movable head 104. Dispenser 100, and first and second UV irradiation devices 102A, 102B are attached to movable head 104.

The display manufacturing device includes a plurality of other components used to stick transparent panel 22 to display module 20. For example, the other components are a stage on which display module 20 is disposed, and a conveying device that conveys transparent panel 22 toward display module 20. In a description of the present exemplary embodiment in the present specification, however, components according to the present exemplary embodiment, that is, dispenser 100 and first and second UV irradiation devices 102A, 102B that are components related to making of dam 56 of first adhesive 52 are mainly described.

Dispenser 100 dispenses first adhesive 52 onto liquid crystal display panel 24 to make dam 56.

First adhesive 52 is dispensed in such a manner that first adhesive 52 straddles front surface 24a of liquid crystal display panel 24 and front plate 26a of bezel 26. Consequently, dam 56 is made. Further, first adhesive 52 is dispensed along inner peripheral edge 26c of bezel 26 (inner peripheral edge surface of front plate 26a). Consequently, annular dam 56 is made. In FIG. 6, first adhesive 52 (dam 56) is cross-hatched. Further, first adhesive 52 is not dispensed in active area 24c (area where an image is displayed) on front surface 24a of liquid crystal display panel 24. That is, first adhesive 52 is dispensed outside a boundary (broken line) of active area 24c.

As illustrated in FIG. 5, first adhesive 52 is dispensed in such a manner that first adhesive 52 straddles front surface 24a of liquid crystal display panel 24 and front plate 26a of bezel 26. Consequently, first adhesive 52 enters between front surface 24a and bezel 26.

More specifically, cushioning member 32 is generally disposed between front surface 24a of liquid crystal display panel 24 and front plate 26a of bezel 26, as illustrated in FIG. 3. Therefore, gap G is formed between front surface 24a and bezel 26. Even if the cushioning member is not disposed, a gap may be designed. The gap is for not allowing front surface 24a and bezel 26 to rub against each other, or to touch each other. Consequently, variation of image quality due to the rubbing or touching is eliminated. First adhesive 52 enters gap G. Further, first adhesive 52 generally has high viscosity. Therefore, first adhesive 52 does not flow over outer peripheral edge of liquid crystal display panel 24, but stops within gap G. A distance that first adhesive 52 enters from inner peripheral edge 26c of bezel 26 depends on a distance between front surface 24a of liquid crystal display panel 24 and bezel 26. For example, if a distance between front surface 24a of liquid crystal display panel 24 and bezel 26 is approximately 1 mm, first adhesive 52 enters approximately 1 mm from inner peripheral edge 26c of bezel 26.

As illustrated in FIG. 5, the display manufacturing device includes first and second UV irradiation devices 102A, 102B to cure dam 56, that is, first adhesive 52 that has been dispensed.

In the present exemplary embodiment, dispenser 100, and first and second UV irradiation devices 102A, 102B are attached to movable head 104 of the display manufacturing device, as illustrated in FIG. 5. Movable head 104 is configured to move parallel to front surface 24a of liquid crystal display panel 24 (to move in X-axis direction and Y-axis direction). Movable head 104 circulates along inner peripheral edge 26c of bezel 26. Consequently, dispenser 100 attached to movable head 104 dispenses first adhesive 52 along inner peripheral edge 26c of bezel 26.

Further, as illustrated in FIG. 5, movable head 104 is configured to turn about turning center line C. Turning center line C passes through a center of resin dispensing outlet 100a of dispenser 100 that dispenses first adhesive 52. Further, turning center line C is perpendicular to front surface 24a of liquid crystal display panel 24. That is, turning center line C extends in Z-axis direction. A reason that movable head 104 is configured to turn about turning center line C will be described later.

First and second UV irradiation devices 102A, 102B attached to movable head 104 are same UV irradiation devices, and are configured to emit light that cures first adhesive 52. If first adhesive 52 is a UV curable resin, for example, first and second UV irradiation devices 102A, 102B emit ultra-violet light.

Figure 7:
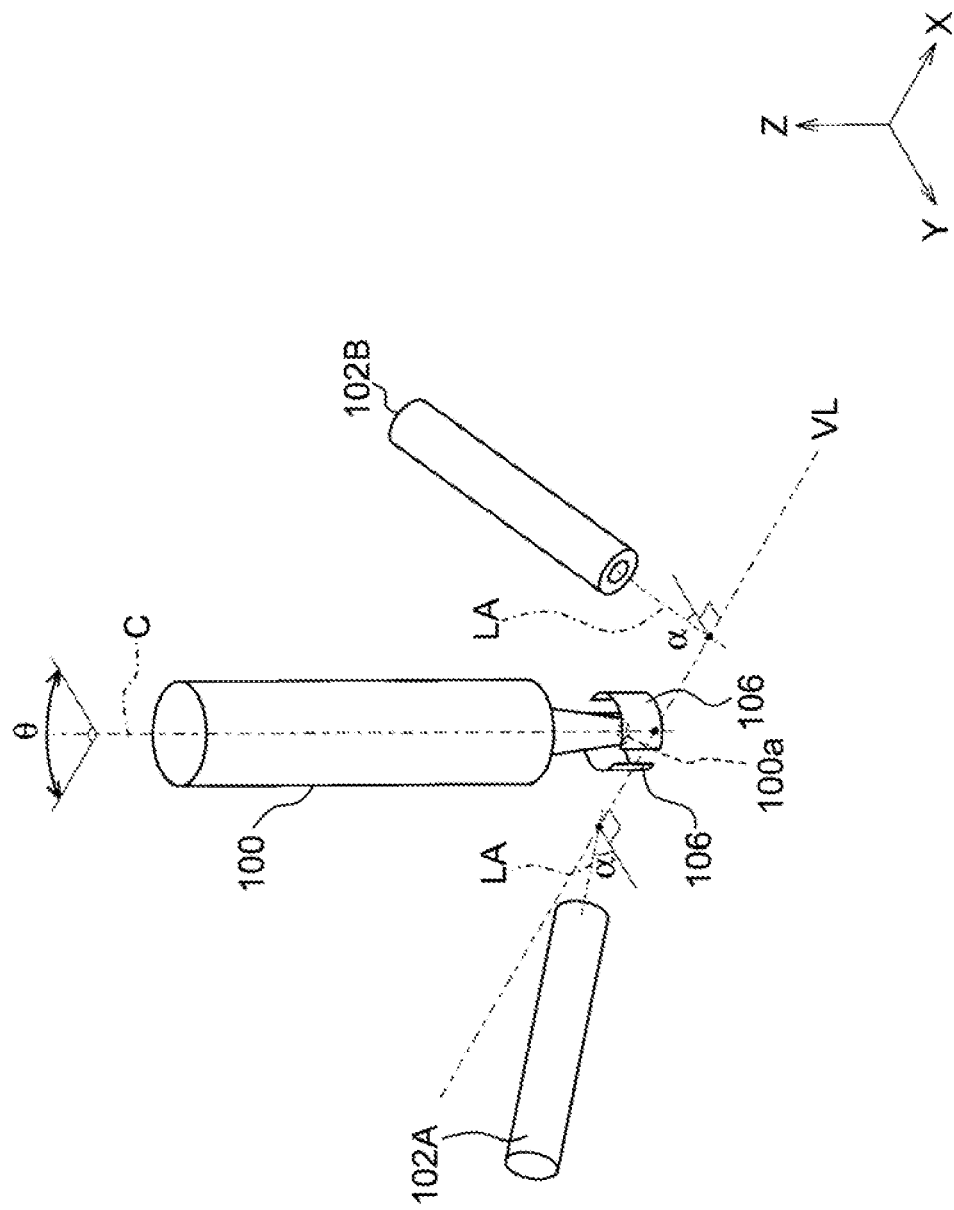
FIG. 7 is a perspective view that illustrates a positional relationship between the dispenser and the UV irradiation devices.

As illustrated in FIG. 5, first and second UV irradiation devices 102A, 102B are attached to movable head 104 in such a manner that first and second UV irradiation devices 102A, 102B are in different postures relative to movable head 104. That is, first and second UV irradiation devices 102A, 102B are disposed in such a manner that first and second UV irradiation devices 102A, 102B are in different postures relative to dispenser 100, as illustrated in FIGS. 4, 6, and 7.

First, a position and a posture of first UV irradiation device 102A relative to movable head 104 (dispenser 100) will be described.

As described above, first adhesive 52 enters gap between front surface 24a of liquid crystal display panel 24 and bezel 26. First UV irradiation device 102A is disposed in such a manner that first UV irradiation device 102A cures first adhesive 52 that has entered the gap.

More specifically, as illustrated in FIG. 5, first UV irradiation device 102A is disposed in such a manner that first UV irradiation device 102A emits light in a direction that forms an acute angle between the direction and front surface 24a of liquid crystal display panel 24, the direction being a direction that allows light to reach first adhesive 52 that has entered a gap between front surface 24a and bezel 26.

More specifically, in the present exemplary embodiment, first UV irradiation device 102A is disposed in such a manner that optical axis La of first UV irradiation device 102A enters the gap between front surface 24a of liquid crystal display panel 24 and bezel 26, as illustrated in FIG. 5. In FIG. 5, optical axes La of UV irradiation devices 102A, 102B are represented by chain lines, and light LL that has been radiated is represented by a continuous line. Therefore, if optical axis La is represented by a chain line in the drawing, a UV irradiation device that has optical axis La represented by the chain line does not emit light.

In the present exemplary embodiment, optical axis La of first UV irradiation device 102A is inclined at angle α relative to front surface 24a of liquid crystal display panel 24. Angle α is less than 90°. The longer a distance that first adhesive 52 enters a gap between liquid crystal display panel 24 and bezel 26 (distance from inner peripheral edge 26c of bezel 26), the smaller angle α is set. A mirror may be used to allow irradiation light from the UV irradiation device to proceed parallel to the front surface of the display panel. Then, the irradiation light may enter between the front surface and the bezel. Therefore, angle α is an angle that is larger than or equal to 0° and less than 90°, that is, an acute angle.

In the present exemplary embodiment, first UV irradiation device 102A is disposed in such a manner that optical axis La of first UV irradiation device 102A that is seen in a direction perpendicular to front surface 24a of liquid crystal display panel 24 (Z-axis direction) is at right angles to inner peripheral edge 26c of bezel 26, as illustrated in FIG. 6.

Further, in the present exemplary embodiment, first UV irradiation device 102A and dispenser 100 are apart from each other in a horizontal direction. More specifically, first UV irradiation device 102A is disposed relative to dispenser 100 in such a manner that optical axis La of first UV irradiation device 102A is distance D apart from turning center line C that pass through a center of resin dispensing outlet 100a of dispenser 100, as illustrated in FIG. 6. That is, geometrically speaking, optical axis La and turning center line C are distance D apart from each other on imaginary straight line VL that is perpendicular to optical axis La and turning center line C and parallel to inner peripheral edge 26c of bezel 26, as illustrated in FIG. 6.

Due to the relative positional relationship, first adhesive 52 is stuck to front surface 24a and then cured. More specifically, movable head 104 moves (movable head 104 moves in a direction represented by arrow A) in such a manner that dispenser 100 is ahead of first UV irradiation device 102A, as illustrated in FIG. 6. Dispenser 100 continuously dispenses first adhesive 52 from resin dispensing outlet 100a of dispenser 100. Consequently, first adhesive 52 is stuck to front surface 24a. First UV irradiation device 102A uses irradiation light LL to continuously cure first adhesive 52. Therefore, dam 56 is continuously made. Further, first adhesive 52 that has entered a gap between front surface 24a of liquid crystal display panel 24 and bezel 26 is cured, as illustrated in FIG. 5.

First UV irradiation device 102A emits irradiation light LL in a direction that is inclined relative to front surface 24a of liquid crystal display panel 24. Irradiation light LL emitted in a direction that is inclined relative to front surface 24a is more likely to cause diffuse reflection on front surface 24a than irradiation light emitted in a direction perpendicular to front surface 24a. Light reflected due to the diffuse reflection may enter resin dispensing outlet 100a of dispenser 100, and may cure first adhesive 52 in dispenser 100. Further, adhesive may start to cure at a position outside and near resin dispensing outlet 100a of dispenser 100, and the cured adhesive may stick to resin dispensing outlet 100a. In that case, the adhesive is not applied in a constant shape that conforms to predetermined set dimensions. To deal with the problem, front surface 24a of liquid crystal display panel 24 has a point of intersection where front surface 24a intersects with optical axis La of first UV irradiation device 102A, as illustrated in FIGS. 4 to 6. Light blocking plate 106 is disposed between the point of intersection and resin dispensing outlet 100a of dispenser 100. Light blocking plate 106 is attached to movable head 104, similarly as first UV irradiation device 102A of dispenser 100. If dispenser 100 is sufficiently apart from first UV irradiation device 102A (distance D is sufficiently long), light blocking plate 106 may be eliminated. Further, the light blocking plate is attached around the dispenser in FIG. 5. However, the light blocking plate attached around first UV irradiation device 102A has a similar effect.

On the other hand, second UV irradiation device 102B is attached to movable head 104 in such a manner that first UV irradiation device 102A and second UV irradiation device 102B have a 180° rotational symmetry about turning center line C of movable head 104, as illustrated in FIGS. 5, 6, and 7. A reason will be described that second UV irradiation device 102B exists, and second UV irradiation device 102B is disposed in such a manner that first UV irradiation device 102A and second UV irradiation device 102B have a 180° rotational symmetry about turning center line C.

As illustrated in FIG. 4, when front surface 24a of liquid crystal display panel 24 is seen in a direction perpendicular to front surface 24a (Z-axis direction), display module 20 is rectangular. Therefore, inner peripheral edge 26c of bezel 26 is rectangular. Therefore, to dispense first adhesive 52 along inner peripheral edge 26c and cure first adhesive 52 that has been dispensed, dispenser 100 and first and second UV irradiation devices 102A, 102B, that is, movable head 104, move along circulation path P that is rectangular.

Circulation path P of movable head 104 includes four straight-line paths P1, P2, P3, and P4, and three corners C1, C2, and C3 that are right-angle of 90°.

Suppose that movable head 104 that moves along circulation path P includes only first UV irradiation device 102A. In that case, first UV irradiation device 102A needs to emit irradiation light LL to a gap between front surface 24a of liquid crystal display panel 24 and bezel 26 while movable head 104 moves four straight-line paths P1, P2, P3, P4. Accordingly, movable head 104 needs to turn 90° about turning center line C at three corners C1, C2, C3 each between the straight-line paths. Therefore, movable head 104 needs to be designed to allow movable head 104 to turn 270° about turning center line C.

However, if movable head 104 turns 270°, a structural problem of the display manufacturing device may occur. For example, dispenser 100 includes a tube through which first adhesive 52 is supplied from an outside of movable head 104. Further, first UV irradiation device 102A includes an optical fiber used to receive light from a light source. If movable head 104 turns 270°, the tube through which first adhesive 52 is supplied may touch the optical fiber of first UV irradiation device 102A. Consequently, movable head 104 may not smoothly turn. Further, dispenser 100 includes electrical wires used to supply electric energy to drive dispenser 100, and signal wires used to transmit control signals. If movable head 104 turns 270°, the tube, the electrical wires, and signal wires may touch each other, and thus the electrical wires and signal wires may break. Further, the optical fiber itself has a specified curvature, and thus generally is not freely bent. Therefore, if a turn of movable head 104 largely bends the fiber, the fiber itself damages.

To deal with the problems, second UV irradiation device 102B is attached to movable head 104 in such a manner that first UV irradiation device 102A and second UV irradiation device 102B have a 180° rotational symmetry about turning center line C of movable head 104. Consequently, movable head 104 only needs to turn 90°.

Figure 8:
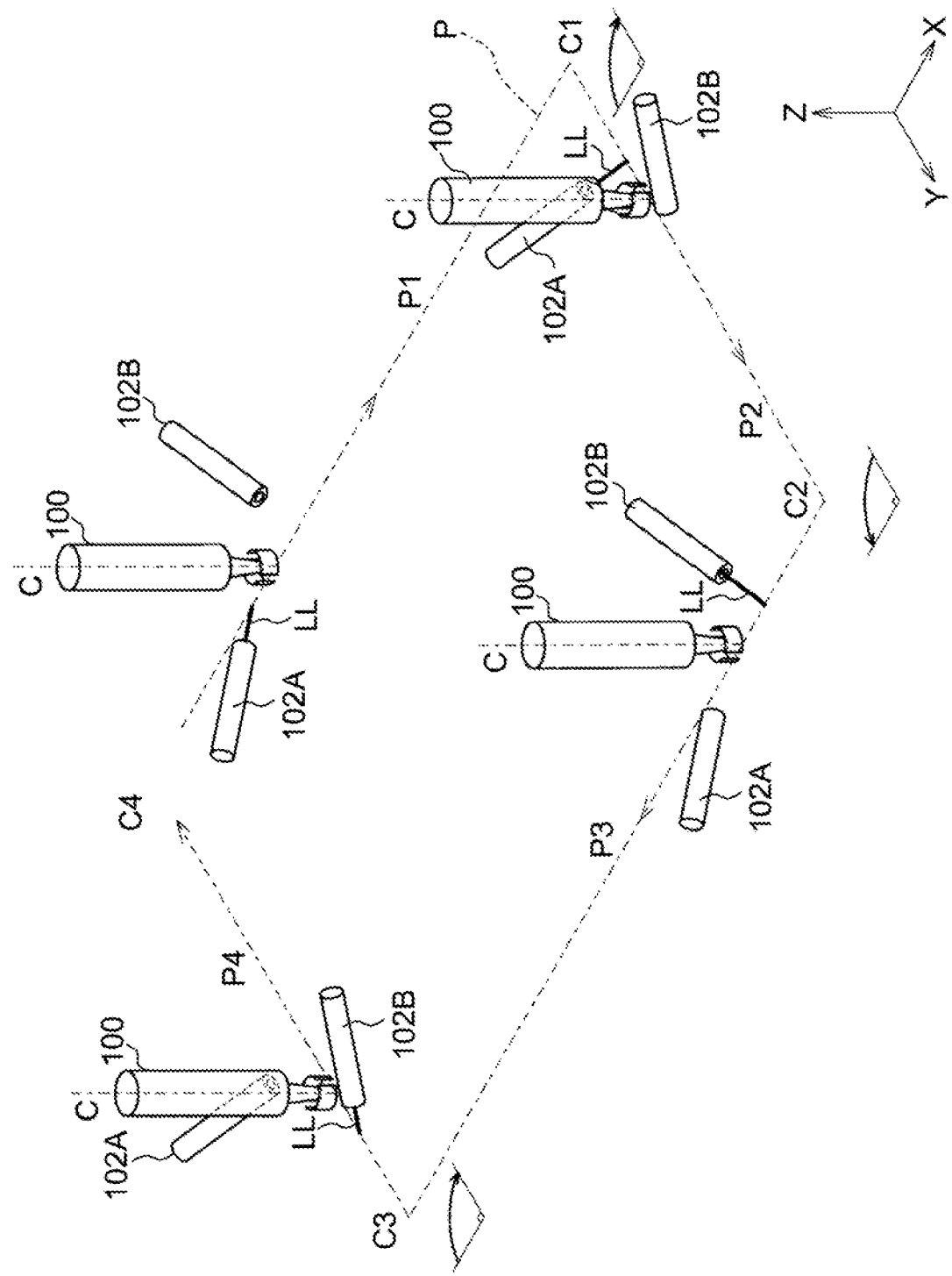
FIG. 8 is a perspective view that illustrates a method for curing a first adhesive with two UV irradiation devices.

More specifically, in straight-line path P1, first UV irradiation device 102A after dispenser 100 emits irradiation light LL to cure first adhesive 52 dispensed from dispenser 100, as illustrated in FIG. 8.

Next, movable head 104 turns 90° forward (clockwise in FIG. 8) at corner C1, and enters straight-line path P2. In straight-line path P2, first UV irradiation device 102A after dispenser 100 emits irradiation light LL to cure first adhesive 52.

Next, movable head 104 turns 90° reverse (counterclockwise in FIG. 8) at corner C2, and enters straight-line path P3. That is, a state of movable head 104 returns to a state of movable head 104 that moves along straight-line path P1.

In straight-line path P3, first UV irradiation device 102A does not emit irradiation light LL, but second UV irradiation device 102B after dispenser 100 emits irradiation light LL to cure first adhesive 52. That is, second UV irradiation device 102B has been in front of dispenser 100 in straight-line path P1. However, second UV irradiation device 102B is after dispenser 100 in straight-line path P3. Straight-line path P3 is parallel to straight-line path P1. Further, along straight-line path P3, movable head 104 moves in a direction that is opposite to a direction in which movable head 104 moves along straight-line path P1. On the other hand, first UV irradiation device 102A has been after dispenser 100 in straight-line path P1. However, first UV irradiation device 102A is in front of dispenser 100 in straight-line path P3. Therefore, in straight-line path P3, second UV irradiation device 102B cures first adhesive 52 instead of first UV irradiation device 102A in straight-line path P1.

Then, movable head 104 turns 90° forward at corner C3, and enters straight-line path P4. That is, a state of movable head 104 becomes a state of movable head 104 that moves along straight-line path P2.

In straight-line path P4, second UV irradiation device 102B after dispenser 100 emits irradiation light LL to cure first adhesive 52.

As described above, first and second UV irradiation devices 102A, 102B are attached to movable head 104 in such a manner that first and second UV irradiation devices 102A, 102B have a 180° rotational symmetry about turning center line C of movable head 104. Therefore, movable head 104 does not need to turn 270°, and turns only 90°. Therefore, movable head 104 that turns 90° causes fewer touching between the tube, the electrical wires, the signal wires, and the optical fiber than movable head 104 that turns 270°. Therefore, the electrical wires, the signal wires, and the optical fiber are less likely to break.

Figure 9:
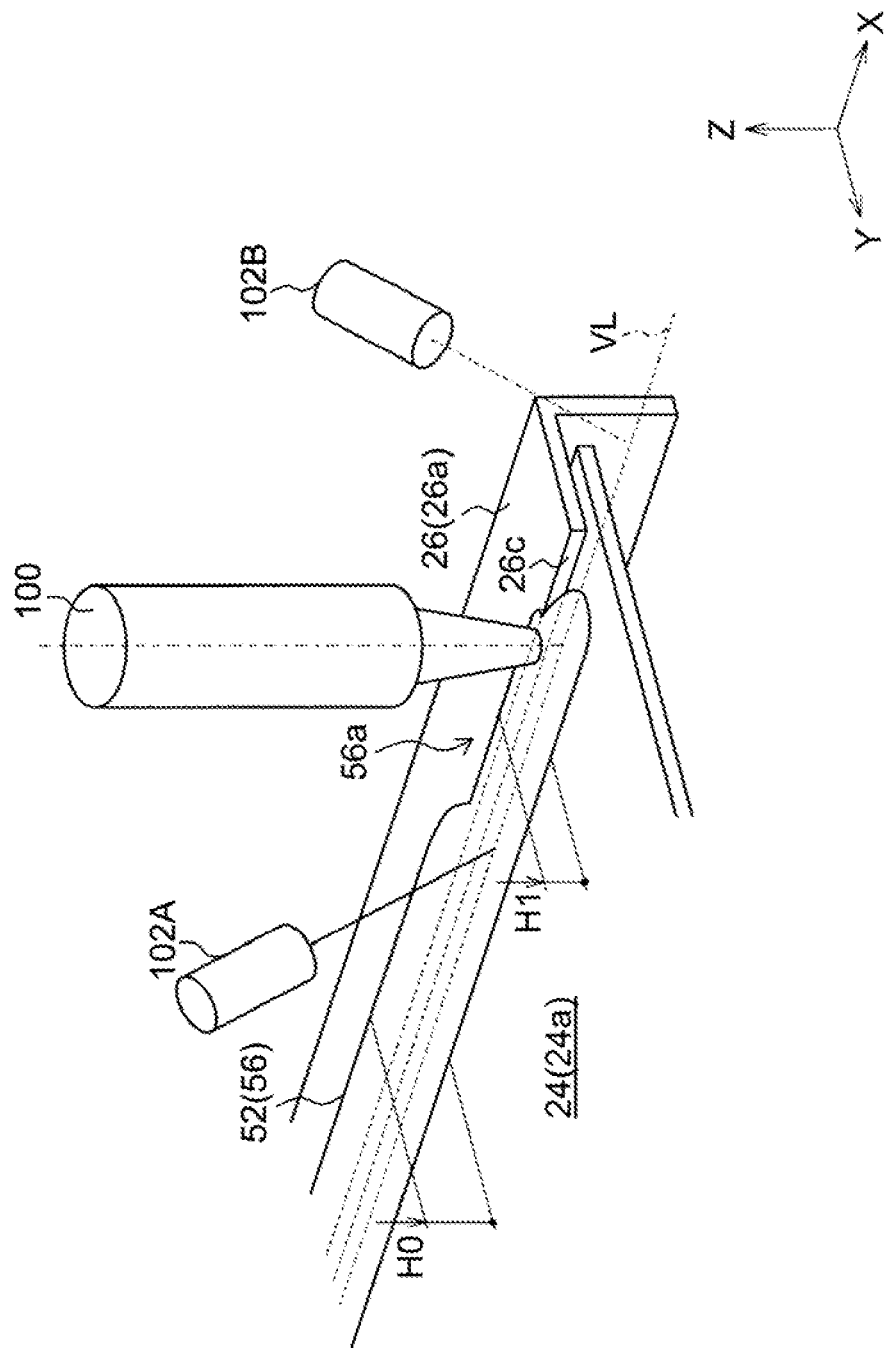
FIG. 9 is a schematic perspective view that illustrates a state at a time of making a dam.

Dispenser 100 and first and second UV irradiation devices 102A, 102B configured as described above make dam 56 that is made of first adhesive 52 and is rectangular (annular), as illustrated in FIG. 9. Then, second adhesive 54 is filled into dam 56. For example, a second dispenser (not illustrated) that is different from dispenser 100 is used to fill second adhesive 54 into an area on front surface 24a surrounded by dam 56.

After second adhesive 54 is filled, transparent panel 22 is disposed on dam 56 and second adhesive 54. For example, a conveying device (not illustrated), such as a robot arm, conveys transparent panel 22 from a position where transparent panel 22 is stored, and disposes transparent panel 22. Then, display module 20 on which transparent panel 22 is disposed is conveyed into a decompression chamber. Air between transparent panel 22 and display module 20 is removed by removing air from the decompression chamber to the outside. Then, transparent panel 22 and display module 20 are disposed at a predetermined position where transparent panel 22 is stuck to display module 20. Consequently, inclusion of air bubbles at a time of the sticking is restricted. Transparent panel 22 and display module 20 that have been stuck to each other are conveyed to an ultra-violet-light irradiation line that is a next process. In the ultra-violet-light irradiation line, ultra-violet light is radiated to a front surface of transparent panel 22. Second adhesive 54 is cured by light irradiation. Consequently, transparent panel 22 is stuck to liquid crystal display panel 24 of display module 20 with first and second adhesives 52, 54. That is, a finished product is made.

As illustrated in FIG. 9, dam 56 may have low-protrusion portion 56a. Height H1 of low-protrusion portion 56a is lower than height H0 of the other portion of dam 56. Heights H1 and H0 are heights from front surface 24a of liquid crystal display panel 24. A gap between low-protrusion portion 56a and transparent panel 22 allows air between transparent panel 22 and display module 20 to be smoothly removed while transparent panel 22 is stuck to display module 20. Consequently, air bubbles are effectively not allowed to remain between transparent panel 22 and liquid crystal display panel 24 that have been stuck to each other. After transparent panel 22 is completely stuck to display module 20, second adhesive 54 spreads almost directly over low-protrusion portion 56a. Second adhesive 54 that has spread almost directly over low-protrusion portion 56a finally seals the gap between low-protrusion portion 56a and transparent panel 22.

To make low-protrusion portion 56a of dam 56, movable head 104 moves at an adjustable speed. While dispenser 100 dispenses adhesive at a constant speed, movable head 104 moves faster than in the other portion. Consequently, an amount of first adhesive 52 dispensed in low-protrusion portion 56a is smaller than in the other portion. Consequently, low-protrusion portion 56a is made which is lower than the other portion. Alternatively, a speed of dispensing from an application head may be changed to similarly make low-protrusion portion 56a. Low-protrusion portion 56a may be made at one of corners of dam 56. Alternatively, a plurality of low-protrusion portions 56a may be made. For example, low-protrusion portions 56a are made near four corners (corners C1, C2, C3, and C4) of circulation path P. Consequently, when transparent panel 22 is stuck to display module 20, air is removed from the four corners, and thus air bubbles between surfaces that have been stuck to each other are more likely to be removed.

Further, as illustrated in FIG. 9, dam 56 is made in such a manner that dam 56 straddles front surface 24a of liquid crystal display panel 24 and front plate 26a of bezel 26. Consequently, dam 56 functions as a seal that seals a gap between front surface 24a of liquid crystal display panel 24 and front plate 26a of bezel 26.

Figure 10:
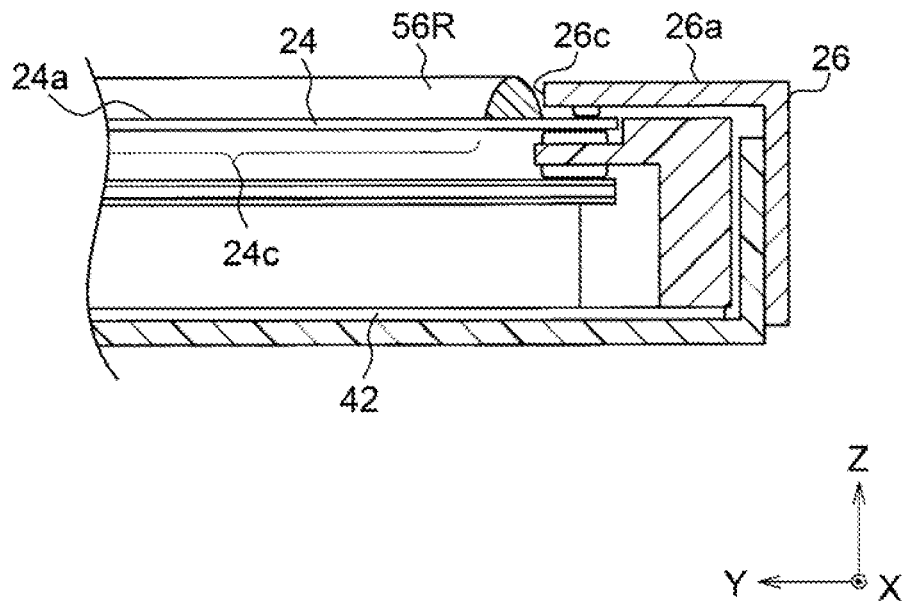
FIG. 10 is a schematic cross-sectional view of part of a display module on which a dam as a comparative example is made.

FIG. 10 illustrates dam 56R as an example for reference. Dam 56R is different from dam 56 according to the present exemplary embodiment. Dam 56R is not made in such a manner that dam 56R straddles front surface 24a of liquid crystal display panel 24 and front plate 26a of bezel 26, but is made only on liquid crystal display panel 24. Therefore, a gap between front surface 24a of liquid crystal display panel 24 and front plate 26a of bezel 26 is not sealed. Therefore, second adhesive 54 that has not cured and goes over dam 56R may enter the gap. Second adhesive 54 that has entered may reach an optical sheet and a light guiding plate that exist inside, and thus may cause display failure.

Therefore, dam 56 made of first adhesive 52 functions as a seal, as illustrated in FIG. 9. Second adhesive 54 is filled into an area surrounded by dam 56 on front surface 24a. Dam 56 does not allow second adhesive 54 that has been filled and has not cured to enter a gap between front surface 24a of liquid crystal display panel 24 and front plate 26a of bezel 26. Further, it is not necessary to prepare an additional seal member that seals the gap. Consequently, display 10 is manufactured that has high reliability (second adhesive 54 does not reach an optical sheet and a light guiding plate). Further, a number of components of display 10 is small (display 10 does not need a seal member), and thus a manufacture cost of display 10 is low.

As described above, in manufacture of display 10 according to the present exemplary embodiment, a simple process is used to appropriately stick transparent panel 22 to liquid crystal display panel 24 whose periphery of front surface 24a is covered by bezel 26. Therefore, display 10 has high reliability.

Exemplary embodiments of the present disclosure are not limited to the exemplary embodiment described above.

In the exemplary embodiment described above, the display manufacturing device includes, for example, first and second UV irradiation devices 102A, 102B attached to one movable head 104 in such a manner that first and second UV irradiation devices 102A, 102B are in different postures (first and second UV irradiation devices 102A, 102B are arranged in such a manner that first and second UV irradiation devices 102A, 102B have a 180° rotational symmetry), as illustrated in FIG. 5. However, exemplary embodiments of the present disclosure are not limited to this example.

For example, there may be two movable heads, and one UV irradiation device may be attached to each of the two movable heads. In that case, in circulation path P illustrated in FIG. 4, one of the movable heads moves along straight-line paths P1, P2, and a UV irradiation device attached to the one of the movable heads emits irradiation light toward a dam made of a first adhesive. Simultaneously, the other movable head moves along other straight-line paths P3, P4, and a UV irradiation device attached to the other movable head emits irradiation light toward a dam made of a first adhesive. In that case, a time required to make a dam is half a time required to make a dam with two UV irradiation devices attached to one movable head, as described in the above exemplary embodiment. The method is especially useful for large displays.

Figure 11:
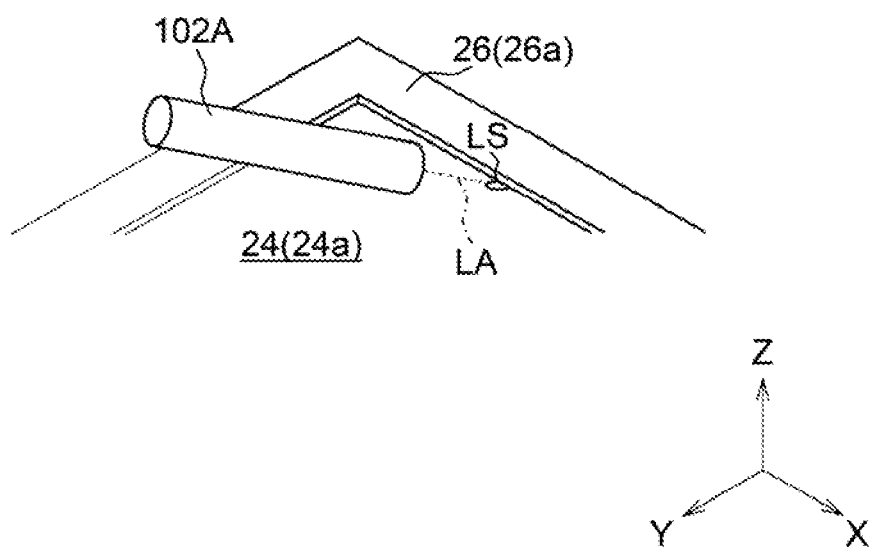
FIG. 11 is a perspective view that illustrates a UV irradiation device according to another exemplary embodiment.

Further, in the above exemplary embodiment, first UV irradiation device 102A is disposed (attached) in such a manner that optical axis La of first UV irradiation device 102A enters a gap between front surface 24a of liquid crystal display panel 24 and bezel 26, as illustrated in FIG. 5. However, exemplary embodiments of the present disclosure are not limited to the above exemplary embodiment. For example, in another exemplary embodiment illustrated in FIG. 11, when first UV irradiation device 102A emits light onto front surface 24a of liquid crystal display panel 24 on which a dam does not exist, at least part of light spot LS of the light on front surface 24a exists in a gap between front surface 24a and bezel 26. First UV irradiation device 102A disposed as described above cures first adhesive 52 that has entered the gap between front surface 24a of liquid crystal display panel 24 and bezel 26.

Further, in the above exemplary embodiment, the display is a liquid-crystal display that includes a liquid crystal display panel. However, exemplary embodiments of the present disclosure are not limited to the liquid-crystal display that includes a liquid crystal display panel. For example, the display may be an organic electroluminescent (EL) display.

Further, in the above exemplary embodiment, the transparent panel is a touch panel. Alternatively, the transparent panel may be a cover panel, such as a cover glass. The bezel is not limited to a component that covers directly over a surface of a panel. That is, a housing of a display, or another component that covers a periphery of a display may have the above effect.

That is, in a broad sense, an exemplary embodiment of the present disclosure is a display manufacturing device for sticking a transparent panel to a display panel whose periphery of a front surface is covered by a bezel. The display manufacturing device includes: a dispenser that dispenses a light curable resin used to stick the transparent panel to the front surface of the display panel, and makes a dam by dispensing the light curable resin in such a manner that the light curable resin straddles the front surface of the display panel and the bezel, and that the light curable resin is along an inner peripheral edge of the bezel; and at least one light irradiation device that emits light that cures the dam. The at least one light irradiation device emits light in a direction that forms an acute angle between the direction and the front surface of the display panel, the direction being a direction that allows the light to reach the light curable resin that has entered a gap between the front surface and the bezel.

Further, in a broad sense, another exemplary embodiment of the present disclosure is a display manufacturing method for sticking a transparent panel to a display panel whose periphery of a front surface is covered by a bezel. The display manufacturing method includes: making a dam by causing a dispenser to dispense a light curable resin used to stick the transparent panel to the front surface of the display panel, the light curable resin being dispensed in such a manner that the light curable resin straddles the front surface of the display panel and the bezel, and that the light curable resin is along an inner peripheral edge of the bezel; and curing the dam with light from a light irradiation device. The light irradiation device emits light in a direction that forms an acute angle between the direction and the front surface of the display panel, the direction being a direction that allows the light to reach the light curable resin that has entered a gap between the front surface of the display panel and the bezel.

Further, in a broad sense, another exemplary embodiment of the present disclosure is a display that includes: a display panel; a bezel disposed in such a manner that the bezel covers a periphery of a front surface of the display panel; a first adhesive that is a light curable resin, the first adhesive being disposed like a dam in such a manner that the first adhesive straddles the front surface of the display panel and the bezel, and that the first adhesive is along an inner peripheral edge of the bezel; a second adhesive filled in the dam; and a transparent panel stuck to the front surface of the display panel with the first and the second adhesives.

As described above, the exemplary embodiments have been described as examples of the technique of the present disclosure. For this purpose, the accompanying drawings and the detailed description have been provided. Therefore, in order to illustrate the above technique, the components described in the accompanying drawings and the detailed description may include not only components that are essential for solving problems but also components that are unessential for solving the problems. Therefore, the unessential components should not be deemed essential just because the unessential components are included in the accompanying drawings and the detailed description.

Since the above exemplary embodiments are intended to exemplify the technique according to the present disclosure, various modifications, replacements, additions, and omissions can be made within the scope of the claims or of equivalents of the claims.

INDUSTRIAL APPLICABILITY

The present disclosure is applicable to a display that includes a display panel and a transparent panel that are stuck to each other, and a manufacturing device and a manufacturing method for manufacturing the display.

What is claimed is:

1. A display manufacturing device for sticking a transparent panel to a display panel, the display panel including a front surface having a periphery covered by a bezel, the display manufacturing device comprising:
    a dispenser that makes a dam by dispensing the light curable resin to straddle the front surface of the display panel and the bezel, and be along an inner peripheral edge of the bezel to stick the transparent panel to the front surface of the display panel, and to have a low-protrusion portion having a height lower than a height of another portion of the dam on the bezel; and
    at least one light irradiation device that emits light that cures the dam,
    wherein the at least one light irradiation device emits the light in a direction that forms an acute angle between the direction and the front surface of the display panel, the direction being a direction that allows the light to reach the light curable resin that has entered a gap between the front surface and the bezel.

2. The display manufacturing device according to claim 1, wherein the at least one light irradiation device is disposed in such a manner that when the at least one light irradiation device emits light onto the front surface of the display panel, at least part of a light spot of the light on the front surface exists in a gap between the front surface of the display panel and the bezel.

3. The display manufacturing device according to claim 2, wherein the at least one light irradiation device is disposed in such a manner that an optical axis of the at least one light irradiation device enters a gap between the front surface of the display panel and the bezel.

4. The display manufacturing device according to claim 1, further comprising a movable head that moves relative to the display panel in such a manner that the movable head moves parallel to the front surface of the display panel, and moves along an inner peripheral edge of the bezel,
    wherein the dispenser and the at least one light irradiation device are attached to the movable head.

5. The display manufacturing device according to claim 4, wherein
    an inner peripheral edge of the bezel has a rectangular shape,
    the at least one light irradiation device includes two light irradiation devices,
    the two light irradiation devices are attached to the movable head, and the movable head is configured to turn 90° about a turning center line that passes through a center of a resin dispensing outlet of the dispenser and is perpendicular to the front surface of the display panel, and
    the two light irradiation devices are attached to the movable head in such a manner that the two light irradiation devices have a 180° rotational symmetry about the turning center line of the movable head.

6. The display manufacturing device according to claim 4, wherein the movable head moves at an adjustable speed.

7. The display manufacturing device according to claim 4, wherein the front surface of the display panel has a point of intersection where the front surface intersects with an optical axis of the at least one light irradiation device, and the movable head includes a light blocking plate disposed between the point of intersection and the resin dispensing outlet of the dispenser.

8. The display manufacturing device according to claim 1, wherein
    an inner peripheral edge of the bezel has a rectangular shape, and
    the low-protrusion portion is made at four corners of the rectangular shape.

9. A display manufacturing method for sticking a transparent panel to a display panel, the display panel including a front surface having a periphery covered by a bezel, the display manufacturing method comprising:
    making a dam by causing a dispenser to dispense a light curable resin to straddle the front surface of the display panel and the bezel, and be along an inner peripheral edge of the bezel to stick the transparent panel to the front surface of the display panel, and to have a low-protrusion portion having a height lower than a height of another portion of the dam on the bezel; and curing the dam with light from a light irradiation device, wherein the light irradiation device emits the light in a direction that forms an acute angle between the direction and the front surface of the display panel, the direction being a direction that allows the light to reach the light curable resin that has entered a gap between the front surface of the display panel and the bezel.

10. A display comprising:

a display panel;

a bezel disposed to cover a periphery of a front surface of the display panel;

a first adhesive that is a light curable resin, the first adhesive being disposed like a dam to straddle the front surface of the display panel and the bezel, and be along an inner peripheral edge of the bezel, and to have a low-protrusion portion having a height lower than a height of another portion of the dam on the bezel;

a second adhesive filled in the dam; and a transparent panel stuck to the front surface of the display panel with the first and the second adhesives.

* * * * *